(12) United States Patent
Kozicki

(10) Patent No.: US 11,984,157 B2
(45) Date of Patent: May 14, 2024

(54) PROGRAMMABLE INTERPOSERS FOR ELECTRICALLY CONNECTING INTEGRATED CIRCUITS

(71) Applicant: Michael Kozicki, Phoenix, AZ (US)

(72) Inventor: Michael Kozicki, Phoenix, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 0 days.

(21) Appl. No.: 17/666,311

(22) Filed: Feb. 7, 2022

(65) Prior Publication Data
US 2022/0262433 A1  Aug. 18, 2022

Related U.S. Application Data

(63) Continuation of application No. 17/025,523, filed on Sep. 18, 2020, now Pat. No. 11,244,722.
(Continued)

(51) Int. Cl.
*G11C 13/00* (2006.01)
*H01L 23/40* (2006.01)
(Continued)

(52) U.S. Cl.
CPC .......... *G11C 13/0011* (2013.01); *H01L 23/40* (2013.01); *H01L 23/528* (2013.01); *H10B 63/00* (2023.02); *H10N 70/245* (2023.02)

(58) Field of Classification Search
CPC ........ G11C 13/0011; G11C 2013/0088; G11C 2213/15; G11C 13/0021; G11C 13/003;
(Continued)

(56) References Cited

U.S. PATENT DOCUMENTS 8,331,128 B1 * 12/2012 Derhacobian ........ G11C 29/816
                                                     365/189.08
9,460,807 B2 * 10/2016 Chung ................. G11C 13/004
(Continued)

FOREIGN PATENT DOCUMENTS

CN       113517393 A   * 10/2021  ......... H01L 45/1253
DE    102020122109 A1  * 10/2021  ......... H01L 45/1253
(Continued)

OTHER PUBLICATIONS

English Machine Translation of Kang et al. (KR101566949B1) dated Jun. 30, 2014. (Year: 2014).

*Primary Examiner* — Michael T Tran
(74) *Attorney, Agent, or Firm* — Michael Best & Friedrich LLP

(57) ABSTRACT

Programmable interposers for connecting integrated circuits, methods for programming programmable interposers, and integrated circuit packaging are provided. The programmable interposers are electrically reconfigurable to allow custom system-in-package (SiP) operation and configuration, field configurability, and functional obfuscation for secure integrated circuits fabricated in non-trusted environments. The programmable interposer includes, in one implementation, an interposer substrate and a programmable metallization cell (PMC) switch. The PMC switch is formed on the interposer substrate and is coupled between a signal input and a signal output. The PMC switch is electrically configurable between a high resistance state and a low resistance state.

16 Claims, 8 Drawing Sheets

Related U.S. Application Data

(60) Provisional application No. 62/903,399, filed on Sep. 20, 2019.

(51) Int. Cl.
    *H01L 23/528*       (2006.01)
    *H10B 63/00*        (2023.01)
    *H10N 70/20*        (2023.01)

(58) Field of Classification Search
    CPC ............ G11C 13/0061; G11C 13/0069; G11C 2013/0071; H01L 23/40; H01L 23/528; H01L 2224/16225; H01L 2924/15311; H01L 23/5382; H10B 63/00; H10B 63/30; H10N 70/245; H10N 70/882
    USPC .................................................. 365/148, 158
    See application file for complete search history.

(56) References Cited

U.S. PATENT DOCUMENTS

| | | | |
|---|---|---|---|
| 9,627,055 B1* | 4/2017 | Robustelli | G06F 13/1657 |
| 9,917,104 B1* | 3/2018 | Roizin | H04B 1/0483 |
| 10,868,246 B2* | 12/2020 | Karpov | H10N 70/8416 |
| 2002/0127886 A1* | 9/2002 | Moore | H10N 70/826 |
| | | | 257/E45.002 |
| 2006/0145610 A1 | 7/2006 | Eifuku et al. | |
| 2010/0006813 A1* | 1/2010 | Xi | H10N 70/8825 |
| | | | 257/E47.001 |
| 2010/0072448 A1* | 3/2010 | Khoueir | H10N 70/882 |
| | | | 257/4 |
| 2010/0193761 A1* | 8/2010 | Amin | H10N 70/8416 |
| | | | 257/4 |
| 2011/0286258 A1* | 11/2011 | Chen | G11C 13/004 |
| | | | 365/189.16 |
| 2013/0134374 A1* | 5/2013 | Kim | H10N 70/8822 |
| | | | 257/2 |
| 2015/0069320 A1* | 3/2015 | Rabkin | G11C 13/003 |
| | | | 438/156 |
| 2015/0123064 A1* | 5/2015 | Schubert | H10N 70/8836 |
| | | | 257/4 |
| 2015/0372060 A1* | 12/2015 | Terai | H10B 63/84 |
| | | | 257/773 |
| 2017/0098469 A1* | 4/2017 | Park | G11C 11/4074 |
| 2017/0230598 A1* | 8/2017 | Takayanagi | H04N 25/71 |
| 2018/0012657 A1* | 1/2018 | Shih | G11C 13/0069 |
| 2018/0197607 A1* | 7/2018 | Bandic | G11C 13/0097 |
| 2018/0211703 A1* | 7/2018 | Choi | H10B 63/24 |
| 2018/0321913 A1* | 11/2018 | Kozicki | G06F 7/588 |
| 2018/0358313 A1* | 12/2018 | Newman | G11C 5/063 |
| 2019/0221739 A1* | 7/2019 | Kim | H10N 70/041 |
| 2020/0006649 A1* | 1/2020 | Jiang | H10N 70/841 |
| 2020/0203604 A1* | 6/2020 | Pillarisetty | H10N 70/8828 |
| 2021/0305508 A1* | 9/2021 | Lee | H10N 70/8828 |
| 2021/0351348 A1* | 11/2021 | Hsu | H10N 70/20 |
| 2023/0206964 A1* | 6/2023 | Shen | G11C 13/0004 |
| | | | 365/163 |
| 2023/0274893 A1* | 8/2023 | Andree | H05K 1/181 |
| | | | 361/502 |

FOREIGN PATENT DOCUMENTS

| | | | | |
|---|---|---|---|---|
| WO | WO-2018057021 A1 * | 3/2018 | ............ | H01L 23/528 |
| WO | WO-2019066964 A1 * | 4/2019 | ......... | G11C 13/0011 |

* cited by examiner

PROGRAMMABLE INTERPOSERS FOR ELECTRICALLY CONNECTING INTEGRATED CIRCUITS

CROSS-REFERENCE TO RELATED APPLICATIONS

This application is a continuation of U.S. application Ser. No. 17/025,523, filed Sep. 18, 2020, now U.S. Pat. No. 11,244,722, which is a non-provisional of and claims benefit of U.S. Provisional Application No. 62/903,399, filed on Sep. 20, 2019, the entire contents of both of which are incorporated herein by reference.

BACKGROUND

Interposers are now used extensively in the semiconductor industry to provide connections between silicon integrated circuits (ICs) and certain types of packages (e.g., a ball grid array (BGA)), and to provide connections between multiple ICs within the same package to create a system-in-package (SiP) design. Interposers can be made from silicon, glass, or organic materials and typically contain fast (low delay) and wide signal conduits and low resistance/low inductance power routing, both of which lead to higher energy efficiency and system design flexibility. Advanced interposers not only contain multiple layers of wiring but can also have integrated passive devices (IPDs), such as resistors, capacitors, or inductors, and through-silicon vias (TSVs), which are electrical connections though the interposer that allow ICs to be placed and interconnected on both sides of an interposer substrate. Interposers are usually fabricated using silicon IC manufacturing equipment in a back-end-of-line (BEOL) fabrication plant using relaxed geometries (e.g., 1 to 8 microns (µm) linewidth) to minimize cost while maximizing performance, although sub-micron linewidth options are currently in development.

SUMMARY

The present disclosure provides a programmable interposer for electrically connecting integrated circuits. In one implementation, the programmable interposer includes an interposer substrate and a programmable metallization cell (PMC) switch. The PMC switch is formed on the interposer substrate and is coupled between a signal input and a signal output. The PMC switch is electrically configurable between a high resistance state and a low resistance state.

The present disclosure also provides a method for programming a programmable interposer for electrically connecting integrated circuits. The programmable interposer includes an interposer substrate and a PMC. The PMC switch is formed on the interposer substrate and is coupled between a signal input and a signal output. The method includes electrically configuring the PMC switch in a low resistance state. The method further includes electrically configuring the PMC switch in a high resistance state.

The present disclosure further provides an integrated circuit packaging including a programmable interposer. In one implementation, the programmable interposer includes an interposer substrate and a PMC switch. The PMC switch is formed on the interposer substrate and is coupled between a signal input and a signal output. The PMC switch is electrically configurable between a high resistance state and a low resistance state.

Those skilled in the art will appreciate the scope of the present disclosure and realize additional aspects thereof after reading the following detailed description of the preferred implementations in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

Figure 1:
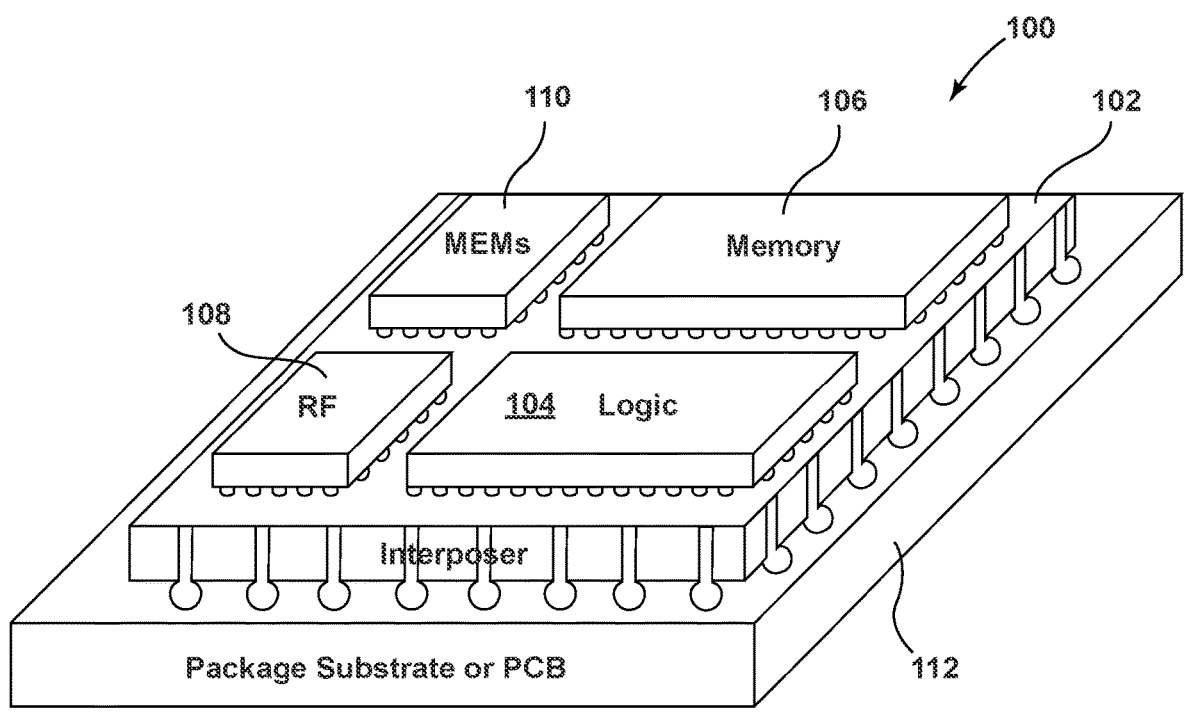
FIG. 1 is a schematic diagram of one example of an integrated circuit (IC) packaging which includes a programmable interposer.

The implementations set forth below represent the necessary information to enable those skilled in the art to practice the implementations and illustrate the best mode of practicing the implementations. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular implementations only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Programmable interposers for integrated circuit (IC) packaging are provided. A programmable interposer, also referred to herein as a smart interposer, can be reconfigured electrically to allow custom system-in-package (SiP) operation and configuration, field configurability, and functional obfuscation in the case of secure ICs fabricated on non-trusted environments. In some implementations, programmable metallization cell (PMC) switches are fabricated on the programmable interposer, so that the programmable interposer can be configured electrically after fabrication and even after the completion of SiP assembly. In some implementations, the PMC switches are based on a copper-silicon oxide (Cu—$SiO_x$) material system. In other implementations, the PMC switches can be based on another oxide electrolyte, such as copper-tungsten oxide (Cu—$WO_3$).

FIG. 1 is a schematic diagram of one example of an integrated circuit packaging 100 which includes a programmable interposer 102. The integrated circuit packaging 100 illustrated in FIG. 1 is a SiP assembly and further includes a plurality of IC components. The plurality of IC components illustrated in FIG. 1 includes a logic component 104 (e.g., a processing device), a memory 106, a radio-frequency (RF) component 108, and a micro-electrical-mechanical systems (MEMS) component 110. In other implementations, the plurality of IC component includes other IC components or other combinations of IC components. The plurality of IC components are interconnected on the programmable interposer 102. The programmable interposer 102 mates with a circuit assembly 112 (for example, a packaging substrate or a printed circuit board [PCB]).

In some implementations, the plurality of IC components are produced on separate production lines that have been optimized for different chip technologies. The programmable interposer 102 includes chip-to-interposer connections and interposer-to-assembly connections, which may be via bumps or micro-bumps consisting of low melting point metals or alloys that liquefy when exposed to moderate temperatures (e.g., mid-200° C. range) and refreeze to form electrical and mechanical couplings.

Manufacturing costs can be reduced by manufacturing interposers with standard elements, such as arrays of through-silicon vias (TSVs), which are used with wiring schemes that are specific to a particular system design. The design of interposer wiring is traditionally performed using standard design tools. A system built on such an interposer can therefore comprise standard or custom ICs (or a combination of both) yet be endowed with custom functionality by the manner in which the interposer connects the IC components to each other, to a power grid, and to passive components on the interposer.

The programmable interposer 102 takes such customization further by having one of more PMC switches fabricated on the interposer, so that the programmable interposer 102 can be configured electrically after fabrication and even after completion of the SiP assembly. In some implementations, the PMC switches are based on a copper-silicon oxide material system (Cu—$SiO_x$, where x<2). One advantage of the material system is that the PMC switches are copper (Cu)-based, which is the same as the metallization used in traditional interposers. Another advantage of the material system is compatibility with existing tools and processes as used in interposer fabrication. A further advantage of the material system is low temperature (<200° C.) deposition so that various interposer materials can be used, including organic substrates. Another advantage of the material system is low voltage and low current operation so that existing power rails can be used without charge pumps. A further advantage of the material system is a highly stable on state, which can be used to control signal and power routing.

It should be understood that other oxide-electrolyte material systems, such as copper-tungsten oxide (Cu—$WO_3$), may also be used and have similar advantages. An example of an oxide-electrolyte-based PMC element for a PMC switch is further illustrated with respect to FIGS. 2A and 2B.

Figure 2A:
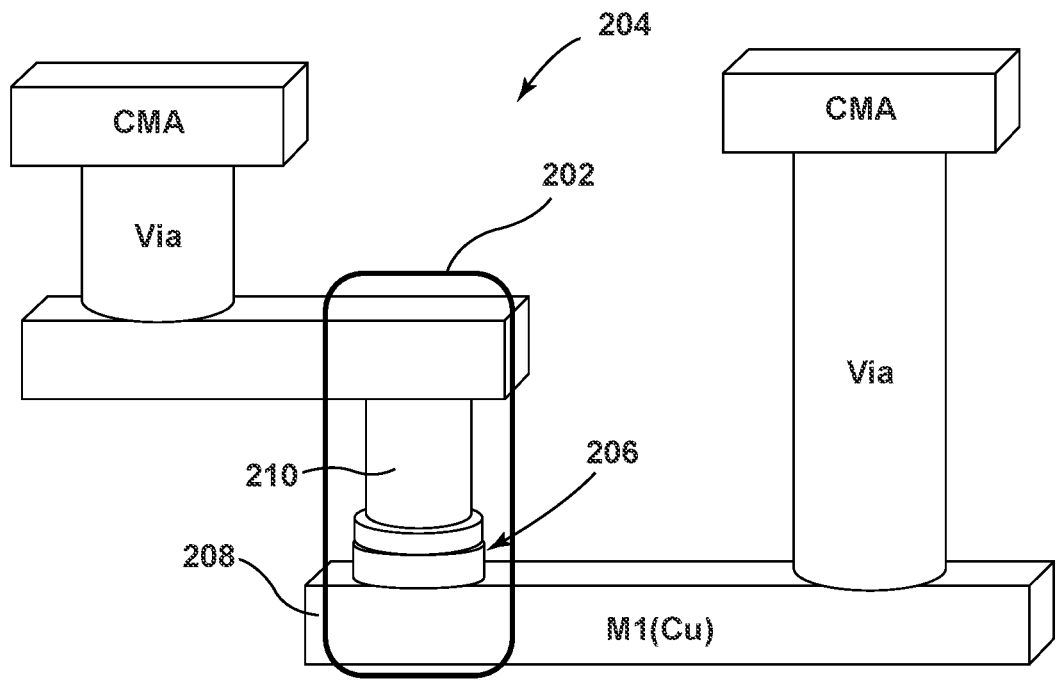
FIG. 2A is a schematic diagram of one example of a programmable metallization cell (PMC) element for a PMC switch.

FIG. 2A is a schematic diagram of one example of a PMC element 202 for a PMC switch 204. The PMC element 202 can be foundry-fabricated in an insulating material (e.g., an interposer substrate or another insulating material coupled to the interposer substrate) using an appropriate material for an ion conductor 206, such as SiOx. Switching the PMC element 202 from a high-resistance (off) state to a low-resistance (on) state occurs by the formation of an oxidizable electrode 208 (e.g., a copper filament) which bridges the ion conductor 206 upon application of a switching threshold voltage $V_{th}$, which may be a small voltage (e.g., +0.6 V on the copper filament) relative to an adjacent indifferent electrode 210 (e.g., a tungsten electrode, which may be grounded). A reverse bias (e.g., of −0.8 V) returns the device to its high resistance state by dissolving the bridge formed by the oxidizable electrode 208. In some implementations, one such PMC element 202 forms the PMC switch 204. In other implementations (discussed further below) multiple PMC elements are used to form a PMC switch. For example, the PMC switch may include a plurality of PMC elements connected in a parallel configuration between a signal input and a signal output. Using a PMC switch with a plurality of PMC elements connected in a parallel configuration lowers the resistance of each PMC element.

In this regard, the oxidizable electrode 208 is formed of a material including a metal that dissolves in the ion conductor 206 when a sufficient bias (e.g., the switching threshold voltage $V_{th}$) is applied across the oxidizable electrode 208 and the indifferent electrode 210. The indifferent electrode 210 is relatively inert and does not dissolve during operation of the PMC element 202. For example, the oxidizable electrode 208 may be an anode during a write process and be comprised of a material including copper that dissolves in the ion conductor, and the indifferent electrode 210 may be a cathode during the write process and include an inert material such as tungsten, nickel, molybdenum, platinum, metal silicides, noble metals, including platinum, ruthenium, iridium, and metal nitrides, including tungsten nitride, titanium nitride, and the like.

Having the oxidizable electrode 208 which dissolves in the ion conductor 206 facilitates maintaining a desired dissolved metal concentration within the ion conductor 206, which in turn facilitates rapid and stable formation of a programmed region within the ion conductor 206 or other electrical property change during use of the PMC element 202. Furthermore, use of an inert material for the indifferent electrode 210 (cathode during a write operation) facilitates electro-dissolution of any programmed region that may have formed and/or return of the PMC element 202 to an erased state after application of a sufficient reverse bias voltage.

During an erase operation, dissolution of a programmed region that may have formed in the ion conductor 206 preferably begins at or near the oxidizable electrode/programmed region interface. Initial dissolution of the programmed region at the oxidizable electrode/programmed region interface may be facilitated by forming the PMC element 202 such that the resistance at the oxidizable electrode/programmed region interface is greater than the resistance at any other point along the programmed region, particularly, the interface between the programmed region and the indifferent electrode 210.

One way to achieve relatively low resistance at the indifferent electrode 210 is to form the indifferent electrode 210 of relatively inert, non-oxidizing material such as platinum. Use of such material reduces formation of oxides at the interface between the ion conductor 206 and the indifferent electrode 210 as well as the formation of compounds or mixtures of the indifferent electrode material and ion conductor material, which typically have a higher resistance than the ion conductor 206 or the indifferent electrode 210.

Relatively low resistance at the indifferent electrode 210 may also be obtained by forming a barrier layer between the oxidizable electrode 208 (anode during a write operation) and the ion conductor 206, wherein the barrier layer is formed of a material having a relatively high resistance. For example, the barrier layer may include ion conductors (such as silver oxide ($Ag_xO$), silver sulfide ($Ag_xS$), silver selenide ($Ag_xSe$), silver telluride ($Ag_xTe$), where x≥2, silver iodide ($Ag_yI$), where y≥1, copper iodide ($CuI_2$), copper oxide (CuO), copper sulfide (CuS), copper selenide (CuSe), copper telluride (CuTe), germanium oxide ($GeO_2$), germanium sulfide ($Ge_zS_{1-z}$), germanium selenide ($Ge_zSe_{1-z}$), germanium tritiide ($Ge_zT_{1-z}$), arsenic sulfide ($As_zS_{1-z}$), arsenic selenide ($As_zSe_{1-z}$), arsenic telluride ($As_zTe_{1-z}$), where z is greater than or equal to about 0.1, and combinations of these materials) interposed between the ion conductor 206 and a metal layer such as silver. The insulating material suitably includes material that prevents undesired diffusion of electrons and/or ions from the PMC element. In some implementations, the insulating material includes silicon nitride, silicon oxynitride, polymeric materials such as polyimide or parylene, or any combination thereof.

Figure 2B:
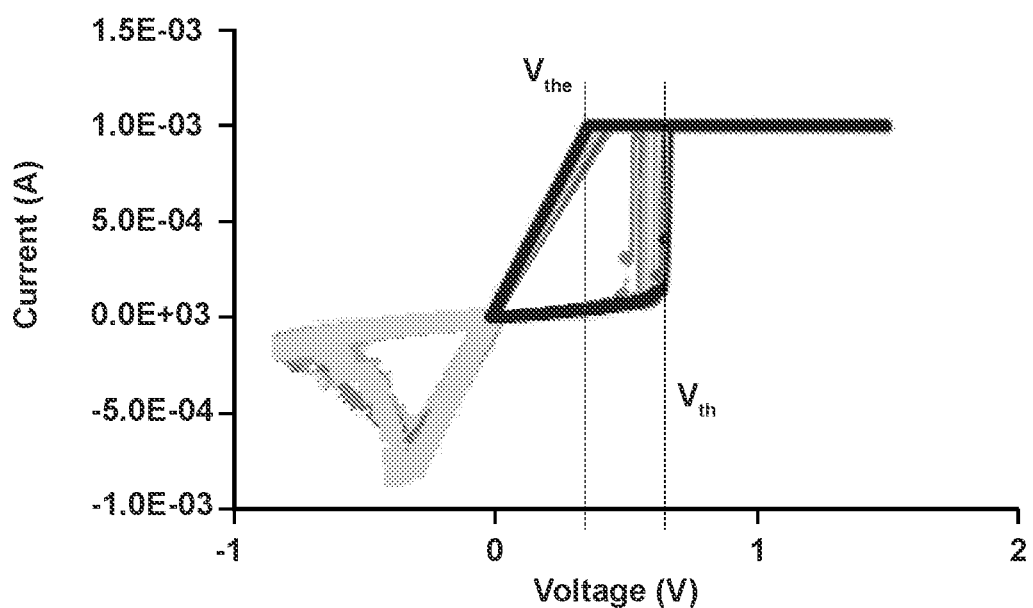
FIG. 2B is a current-voltage (I/V) plot of several write-erase cycles of the PMC switch of FIG. 2A.

FIG. 2B is a current-voltage (I/V) plot of several write-erase cycles of the PMC element 202 of FIG. 2A. The I/V plot illustrates the effect of switching the PMC element 202 between on and off states by showing several write-erase cycles (switching from off to on, then back to off) with a current limit of 1 mA, which leads to an on-state resistance in the order of 300Ω in this example.

By using one or more of these PMC elements to control how ICs and/or circuit elements connected to the programmable interposer (e.g., smart interposer) of FIG. 1 are connected, various configurations are possible. For example, a signal line from one IC to another can be physically interrupted by the PMC element 202, which would essentially act as an anti-fuse (e.g., having no connection between the ICs in the off state while connecting the ICs in the on state). However, in this configuration, an off-state element could be unintentionally switched on by voltages that appear on the signal lines. For example, if a first signal line connected to a copper filament were high (logic 1) while a second signal line connected to a tungsten electrode is low (logic 0), the PMC element could switch from its high resistance (off) to its low resistance (on) state. This could be prevented by ensuring that the device switching threshold voltage $V_{th}$ is in excess of the voltage differential (for example, setting $V_{th}$>$V_{dd}$-ground, for a worst case). Alternatively, a three-terminal arrangement could be used, as described with respect to FIG. 3A.

Figure 3A:
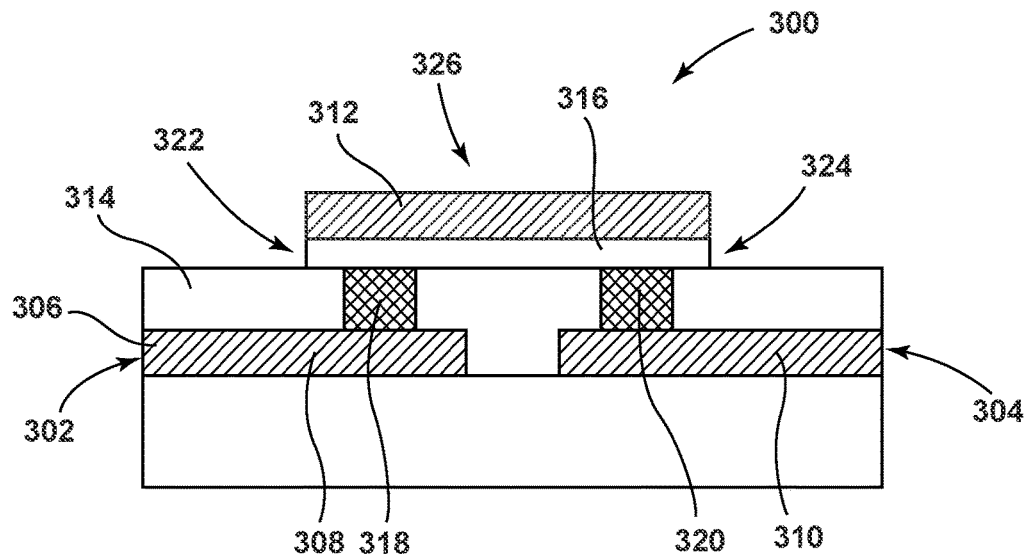
FIG. 3A is a schematic diagram of one example of a three-terminal PMC switch.

FIG. 3A is a schematic diagram of one example of a three-terminal PMC switch 300. In the three-terminal PMC switch 300, a signal (or power) is carried from a transmitting end 302 (an example of a "signal input") to a receiving end 304 (an example of a "signal output") in a first copper interconnect layer 306. The first copper interconnect layer 306 includes a first copper electrode 308 and a second copper electrode 310, which are discontinuous such that the transmitting end 302 and the receiving end 304 are not connected when the three-terminal PMC switch 300 is not being programmed. The first copper interconnect layer 306 is separated from a second copper interconnect layer 312 by an inter-layer dielectric material 314 (e.g., silicon dioxide ($SiO_2$), silicon nitride ($Si_3N_4$), organic films, etc.) (one example of an "insulating material"). The second copper interconnect layer 312 (one example of an "oxidizable electrode") is further separated from the first copper interconnect layer 306 by an ion conductor 316.

A first tungsten plug 318 and a second tungsten plug 320 are formed in vias in the inter-layer dielectric material 314, rising from the first copper interconnect layer 306 to form cathodes of a first PMC element 322 and a second PMC element 324. The first tungsten plug 318 and the second tungsten plug 320 are examples of indifferent electrodes. A section of the second copper interconnect layer 312 forms a common copper anode for both the first PMC element 322 and the second PMC element 324, such that the PMC elements 322 and 324 are arranged in a back-to-back configuration. This ensures that a voltage differential from the transmitting end 302 to the receiving end 304 (with connection 326 at the second copper interconnect layer 312 floating) will not switch this two-element configuration into a conducting/low resistance state, as one of the PMC elements (e.g., the first PMC element 322) will always be reverse biased (e.g., $+V_{dd}$ on the first tungsten plug 318 and ground on the first copper electrode 308), and therefore will be unable to switch to its low resistance state. At the same time, the other PMC element (e.g., the second PMC element 324), even though forward biased, will have insufficient bias across it to switch to its low resistance state due to the voltage drop across the reverse biased element, such that the three-terminal PMC switch 300 will not spontaneously switch in normal operation.

Figure 3B:
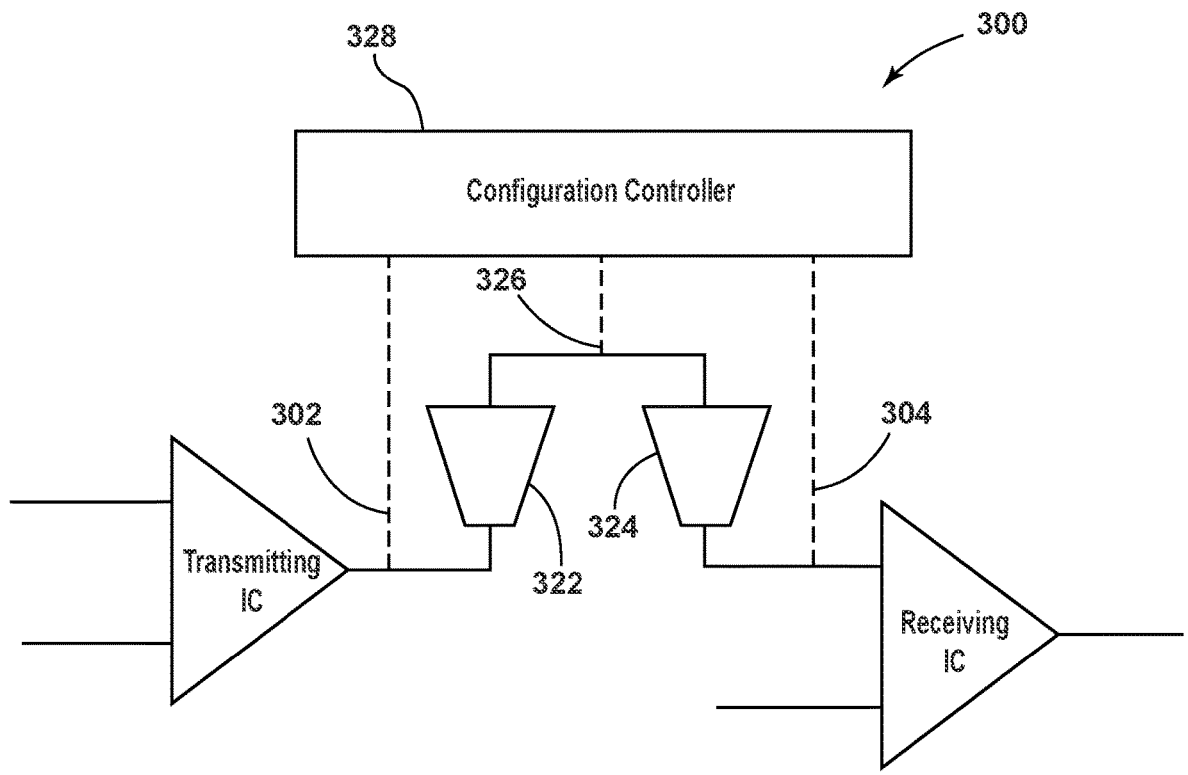
FIG. 3B is a circuit schematic of one example of the three-terminal PMC switch of FIG. 3A with a configuration controller.

FIG. 3B is a circuit schematic of the three-terminal PMC switch 300 of FIG. 3A with a configuration controller 328. With reference to FIGS. 3A and 3B, a voltage is applied to the common anode (e.g., a section of the second copper interconnect layer 312) through the connection 326 from the configuration controller 328 to bridge the discontinuity in the first copper interconnect layer 306 of the three-terminal PMC switch 300. The configuration controller 328 may be a separate IC on the interposer or an external system connected to the interposer through package pins, while the transmitting end 302 and the receiving end 304 are grounded, either simultaneously or sequentially. This will switch both PMC elements 322 and 324 into the low resistance state.

An on-state resistance $R_{on}$ of the three-terminal PMC switch 300 is a function of a programming current $I_{prog}$ given by the relationship:

$$R_{on} = V_{the}/I_{prog}$$

where $V_{the}$ is a threshold voltage for the continued formation of the conducting filament after it has been initiated, around 0.2 to 0.3 V for the Cu—$SiO_x$ system (as noted above with respect to FIG. 2B). This means that a programming current of 1 mA will result in a 300-ohm on-state, as is the case in the PMC element of FIG. 2, and a 5 mA programming current will ensure that both on-state elements in series will have a combined resistance in the order of 100-ohm.

The configuration controller 328 is capable of supplying such programming currents during programming; if the programming of the PMC elements 322 and 324 is performed simultaneously rather than sequentially, then the current supplied by the control circuit through connection 326 will be twice the amount for a single PMC element. Note that when the three-terminal PMC switch 300 is not being programmed, the transmitting end 302, the receiving end 304, and connection 326 would be floating so as not to interfere with the operation of the system (as further described below). When both PMC elements 322 and 324 are in their low resistance state, the voltage drop across both will be insufficient to switch the reverse biased device to its high resistance state under any circumstances, so the configuration will be stable in this on-state.

The above mode of operation is called "hard programming," as it creates a final circuit/system configuration that will not be changed for the life of the part. However, it might also be desirable in some cases to have a "soft programming" function, to allow testing of multiple configurations prior to the final circuit commitment, or to possibly allow system reconfiguration in the field. In this case, the programming current $I_{prog}$ would be lower, in the order of a few hundred μA, resulting in a higher on-state resistance (several kΩ) which can be easily erased by applying a reverse bias to the PMC elements from the control circuit, and re-programmed again (e.g., several hundred times) if desired. In some cases, this would only be applicable to signal routing as the higher resistance in the interconnect pathway would create too much voltage drop for power routing applications. Even in the signal routing case, there will be a time delay due to the presence of the high resistance elements in the signal path, so the soft programming mode may not be used in high frequency applications or high-speed system testing.

Figure 3C:
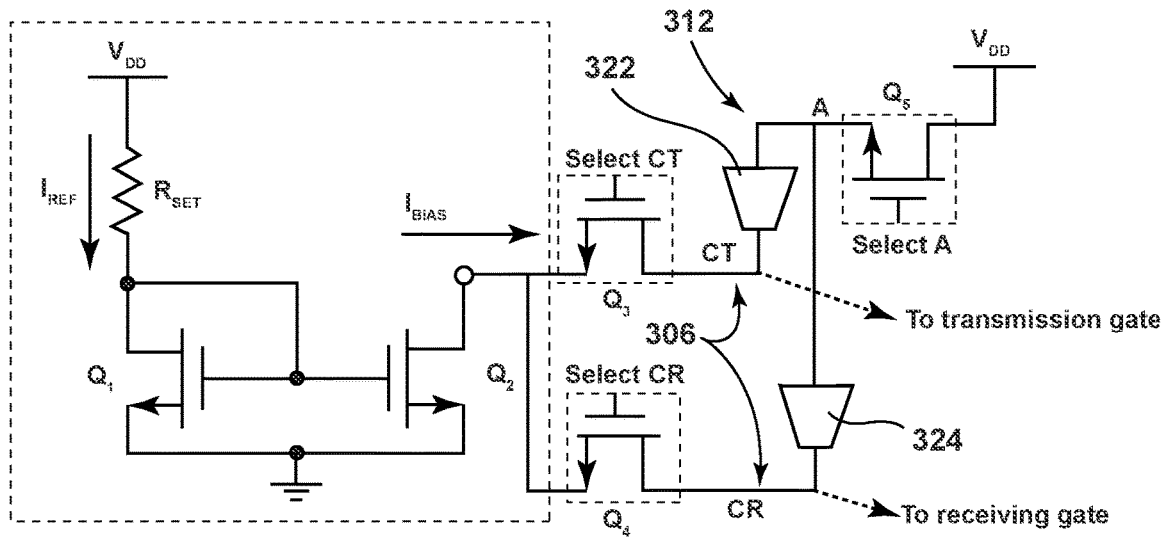
FIG. 3C is a circuit schematic of one example of control and configuration components for the three-terminal PMC switch of FIG. 3A.

FIG. 3C is a circuit schematic for control and/or configuration of the three-terminal PMC switch 300 of FIG. 3A. In this, the reference current is set by the value of $R_{set}$ in a constant current source (shown in a box on the left), and this determines the bias current (e.g., programming current $I_{prog}$) that flows through a selected PMC element. Pass transistors $Q_3$, $Q_4$, and $Q_5$ allow this current to flow through the selected PMC element. These transistors are designed so that their on resistance is low (e.g., their width to length ratio is relatively large), but with high off resistance that allows the PMC elements to float when they are not being programmed.

To select a PMC element to program, the pass transistors at both ends of the element must be turned on. To program the first PMC element 322 on the transmission gate side of the break in the first copper interconnect layer 306, pass transistors $Q_3$ and $Q_5$ would be turned on, while programming of the second PMC element 324 on the receiving gate side would be accomplished by turning on pass transistors $Q_4$ and $Q_5$. In the programmable interposer (e.g., smart interposer) of FIG. 1, each three-terminal PMC switch would have its own set of three pass transistors, which may all be fed from the same current source or from separate current sources. These pass transistors could be integrated with the current source(s) on a separate control IC that is part of the SiP design or the control IC could reside off-package if the programmable interposer was only to be programmed using an external programmer. Note that in the case of an external system programmer, it is also possible to use relays rather than pass transistors as long as the three-terminal PMC switch density is not too high (e.g., programmable interposer is limited to a few hundred three-terminal PMC switches). In the case of very large numbers of three-terminal PMC switches in the programmable interposer (e.g., several thousand and greater), multiple control ICs and multiplexed lines may be necessary to reduce the number of control lines on the programmable interposer.

Figure 3D:
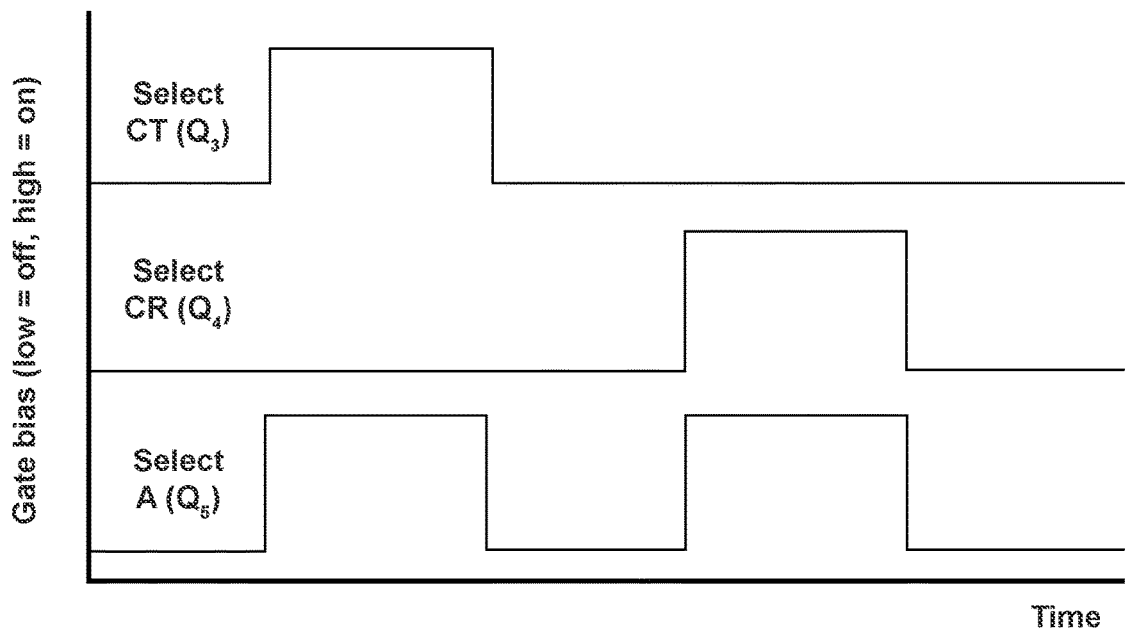
FIG. 3D is a select transistor timing diagram for one example of sequential programming of PMC elements in the three-terminal PMC switch of FIG. 3C.
Figure 3E:
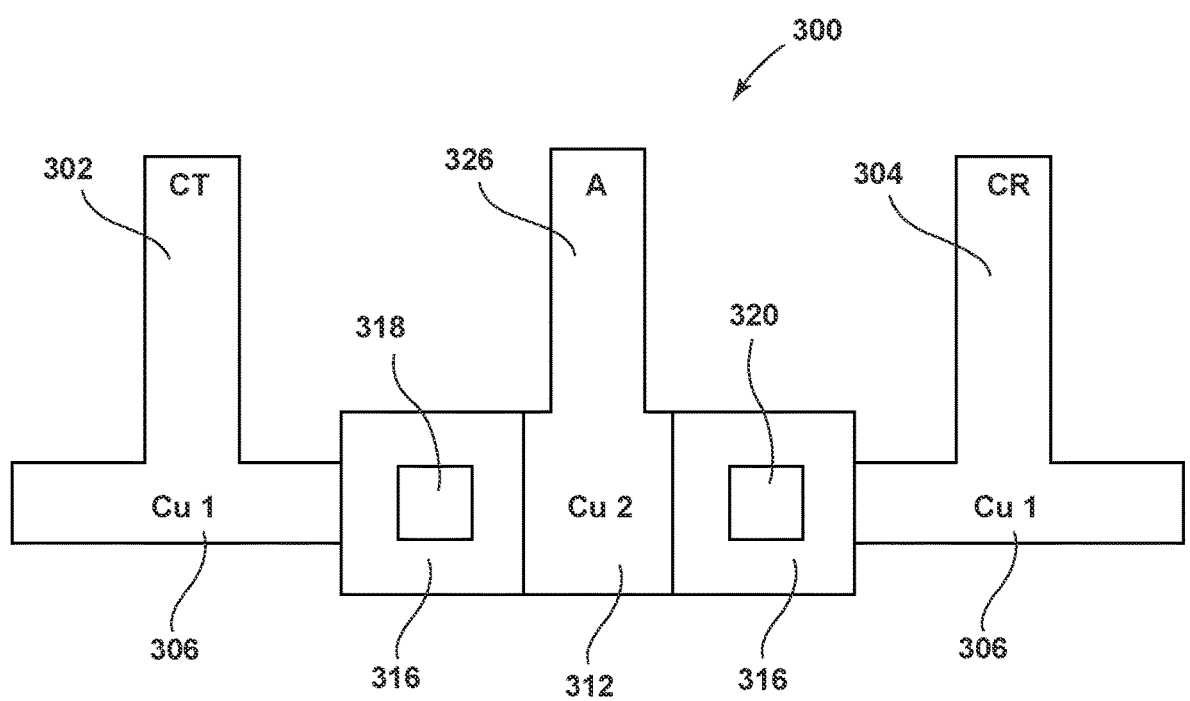
FIG. 3E is a plan view of the three-terminal PMC switch of FIG. 3A.

FIG. 3D is one example of a pass transistor timing diagram for sequential programming of PMC elements in the three-terminal PMC switch 300 of FIG. 3C. In this example, the "T" side element is programmed first ($Q_3$ and $Q_5$ are on, $Q_4$ is off), and then the "R" side element is programmed ($Q_4$ and $Q_5$ are on, $Q_3$ is off). The pass transistors are on for a time that is sufficient for the PMC element to reach its stable low resistance configuration (e.g., 1 millisecond (ms)). Note that if the elements were to be programmed simultaneously, the current source would have to produce twice the current required for each element. This would bring the three-terminal PMC switch 300 to around 100-ohm, requiring at least 5 mA per element, which would equate to 10 mA for simultaneous programming. While this may be acceptable in some cases, it does require wider and/or thicker metallization on the common programming line (A), which will reduce the density of the programming interconnect. FIG. 3E is a plan view of the three-terminal PMC switch 300 of FIG. 3A.

Figure 4A:
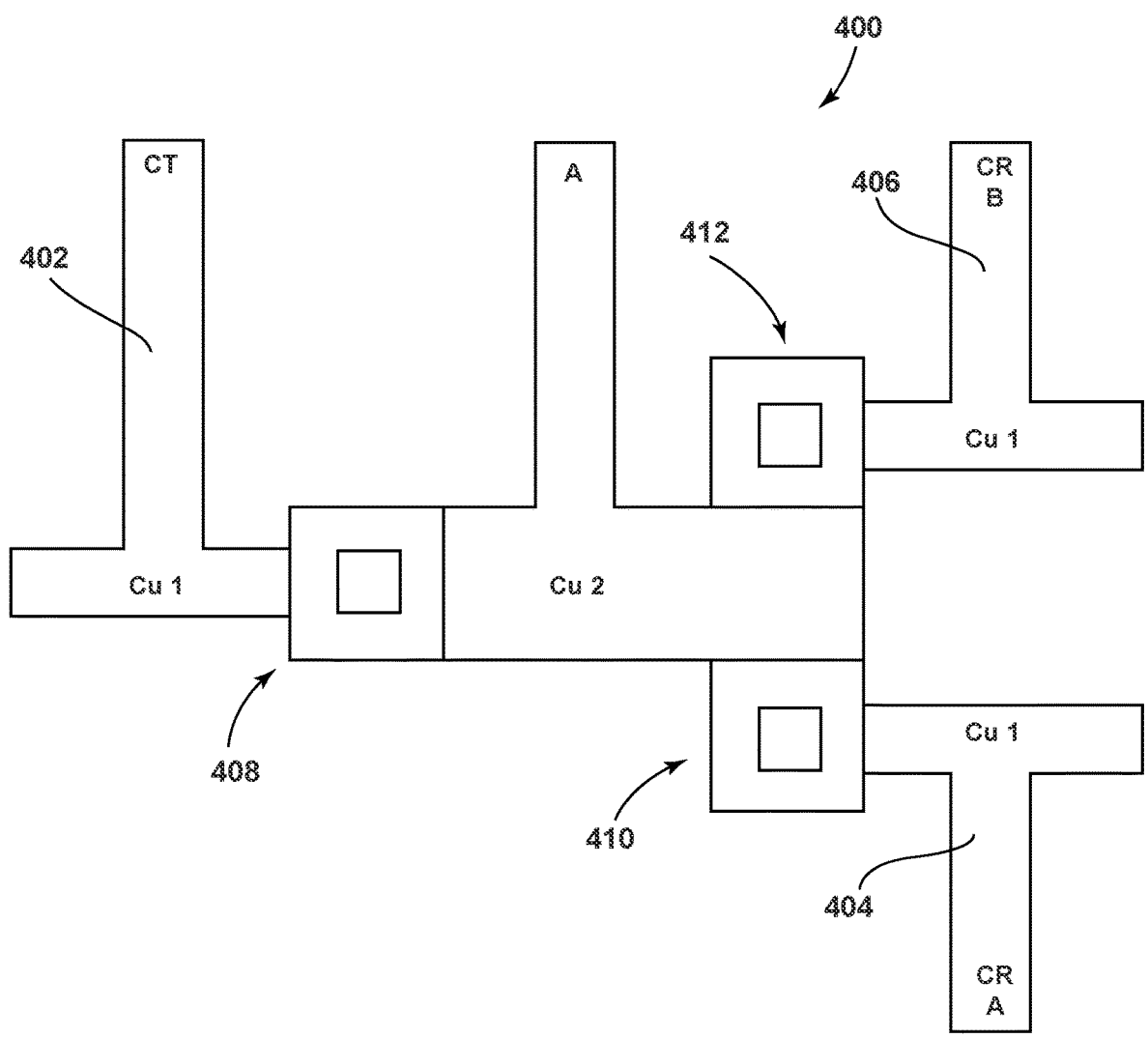
FIG. 4A is a plan view of one example of a four-terminal PMC switch having one input and two outputs.
Figure 4B:
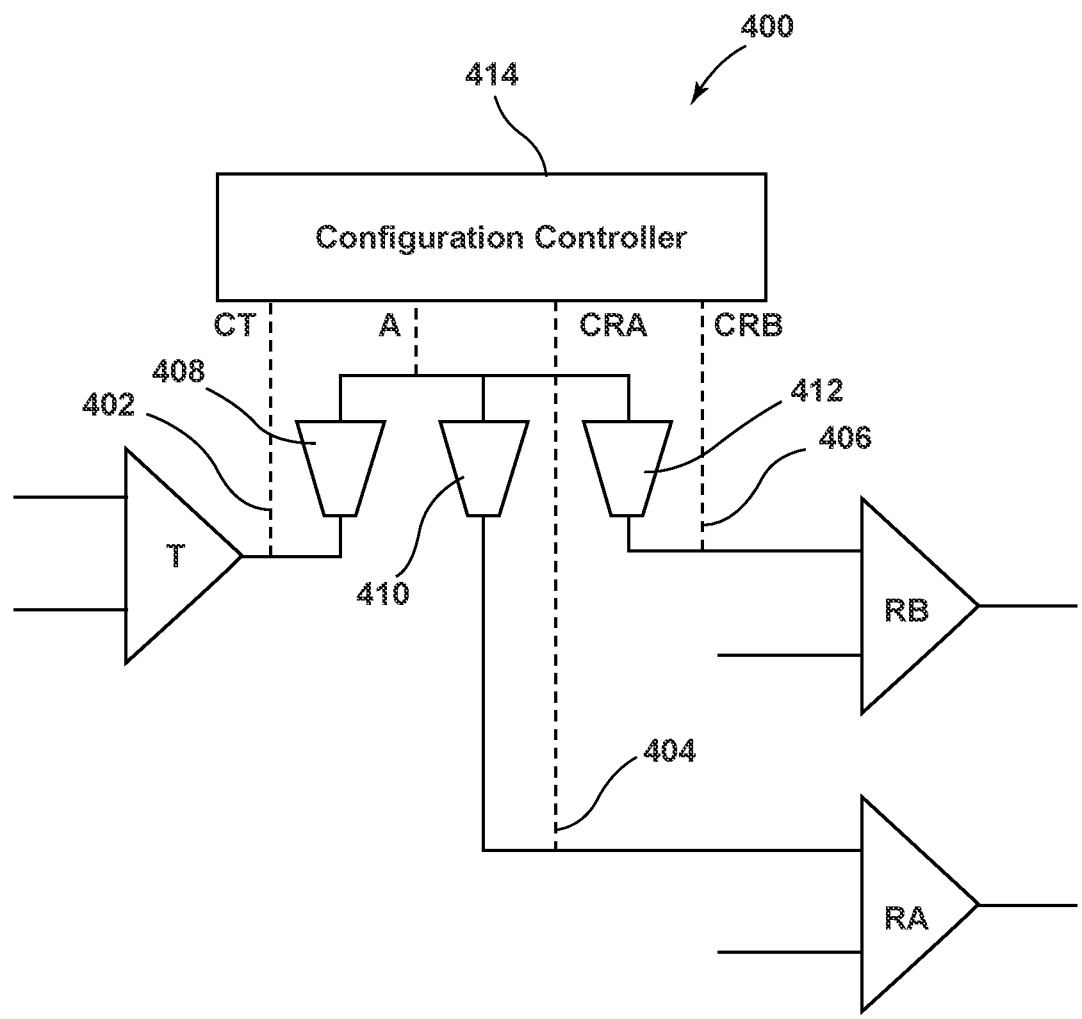
FIG. 4B is a circuit schematic of the four-terminal PMC switch of FIG. 4A.

FIG. 4A is a plan view of one example of a four-terminal PMC switch 400 having one input and two outputs. FIG. 4B is a circuit schematic of the four-terminal PMC switch 400 of FIG. 4A. The four-terminal PMC switch 400 includes a signal input 402, a first signal output 404, a second signal output 406, a first PMC element 408, a second PWC element, 410, a third PMC element 412, and a configuration controller 414. A major advantage of having a switching device comprised of individual PMC elements is that more elements can be added to create devices that not only switch a single interconnect line but also can switch between lines. For example, in the four-terminal PMC switch 400, the signal (or power) can be routed from the signal input 402 to either the first signal output 404, the second signal output 406, or both, by turning on the appropriate PMC elements via bias applied by the configuration controller 414. It should be understood that other examples can have additional signal outputs, multiple inputs to a single signal output, and other configurations in a similar manner as described above.

Figure 5:
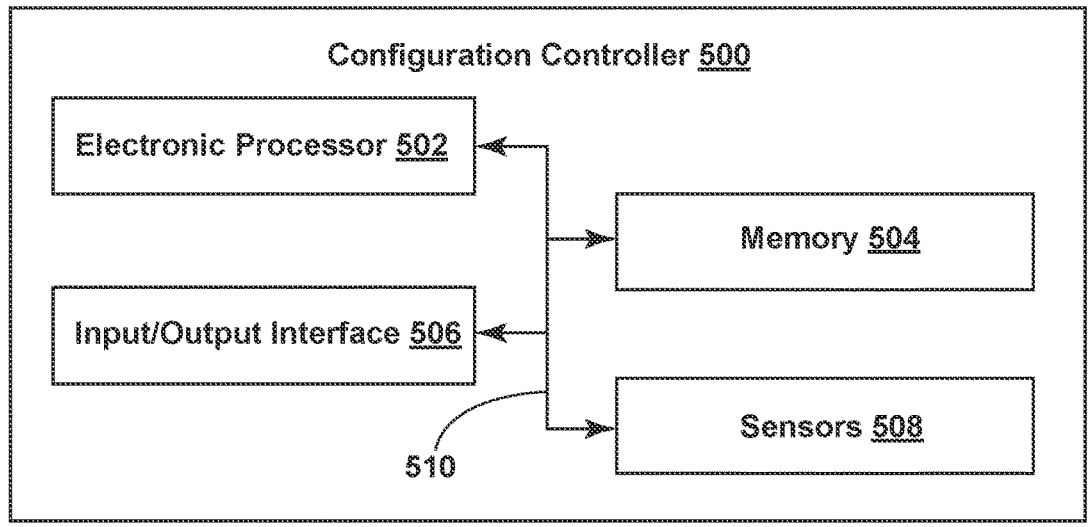
FIG. 5 is a block diagram of one example of a configuration controller.

FIG. 5 is a block diagram of one example of a configuration controller 500. The configuration controller 500 illustrated in FIG. 5 includes an electronic processor 502 (for example, one or more microprocessors, ASICs, SoCs, or other electronic controllers), memory 504, an input/output interface 506, sensors 508, and a bus 510. The bus 510 connects various components of the configuration controller 328 including, for example, the memory 504 to the electronic processor 502. The memory 504 includes read only memory (ROM), random access memory (RAM), an electrically erasable programmable read-only memory (EEPROM), other non-transitory computer-readable media, or a combination thereof. The electronic processor 502, in one implementation, is configured to retrieve program instructions and data from the memory 504 and execute, among other things, instructions to perform the methods described herein. Alternatively, or in addition to, the memory 504 is included in the electronic processor 502. The input/output interface 506 includes routines for transferring information between components within the configuration controller 500 and components external to the configuration controller 500. The input/output interface 506 is configured to transmit and receive signals via wires, fiber, wirelessly, or a combination thereof. Signals may include, for example, control signals, information, data, serial data, data packets, analog signals, or a combination thereof. The sensors 508 detect electrical characteristics of the programmable interposer 102. For example, the sensors 508 measure voltage and/or current values at various nodes and junctions of the programmable interposer 102.

Figure 6:
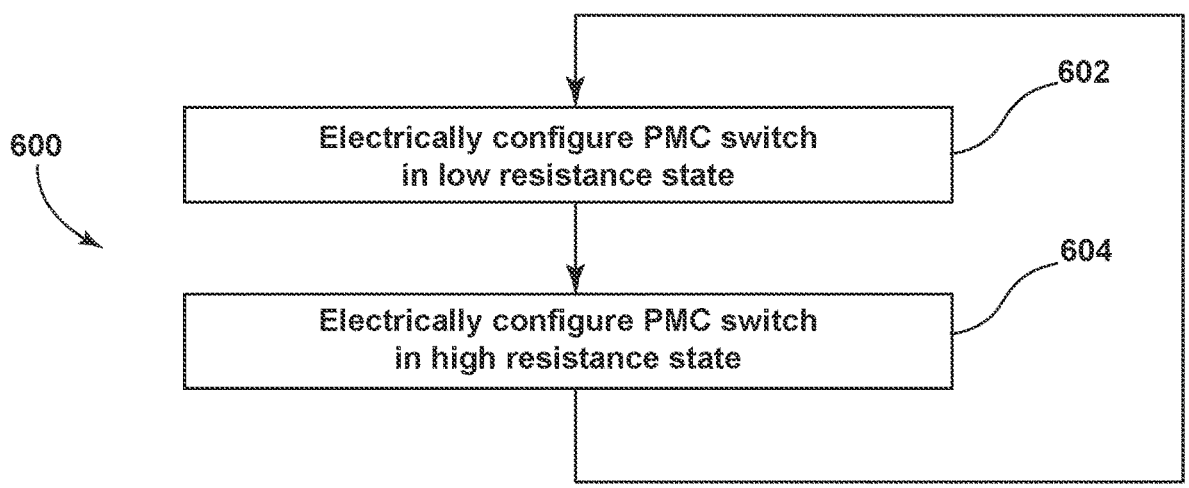
FIG. 6 is a flow diagram of one example of a method for programming a programmable interposer for electrically connecting integrated circuits.

FIG. 6 is a flow diagram of one example of a method 600 for programming the programmable interposer 102 for electrical connecting integrated circuits. For illustrative purposes, the method 600 is described in relation to the PMC switch 204 illustrated in FIG. 2A. At block 602, the PMC switch 204 is electrically configured in the low resistance state. In some implementations, a switching threshold voltage is applied to the PMC switch 204 (for example, by the configuration controller 500). At block 604, the PMC switch 204 is electrically configured in the high resistance state. In some implementations, a reverse bias voltage is applied to the PMC switch 204 (for example, by the configuration controller 500).

The programmable interposers described herein provides several advantages over traditional interposers. One advantage is the customization of system function. Even using the same chipset, the programmable interposers described herein enable customization of functionality by configuring the routing of, for example, data (and address) buses, enables/hard interrupts, power lines, and integrated passive devices (IPDs), such as resistors, capacitors, or inductors, and TSVs—not only in/out configurations, but also trimming by connecting different passive devices. The programmable interposers described herein also enable ultra-custom/one-off systems to be constructed, which would be prohibitively expensive in hard-design approaches.

Another advantage is field configurability. The programmable interposers described herein are programmed during system assembly, but electrical configurability means that the final system configuration may be achieved during the final test of the completed SiP or even in the field by the end user. This would allow the customer to set functionality based on a particular use circumstance or to provide just-in-time updated versions of the configuration.

Another advantage is reconfigurability. A reversal of bias can erase a programmed PMC element to allow it to be later reprogrammed if desired. This ability to be cycled allows configurations to be changed, either during testing in the factory or by the user in the field, e.g., to provide functional updates. In general, soft programmed devices are capable of handling more write-erase cycles than hard programmed devices (e.g., over 1,000 cycles for soft programmed devices, less than 100 cycles for hard programmed devices), but the on state resistance of soft programmed devices is relatively high and so will limit system testing to "slow" modes of operation.

A further advantage is functional obfuscation. Secure systems often comprise ICs fabricated in non-trusted environments. To build a secure system with these ICs, the final system configuration (including signal, power, and passive device connections) should be conferred in a trusted facility so that the true (and perhaps secret) functionality of the system only emerges at the point of programmable interposer programming.

Those skilled in the art will recognize improvements and modifications to the preferred implementations of the present disclosure. All such improvements and modifications are considered within the scope of the concepts disclosed herein and the claims that follow.

What is claimed is:

1. A programmable interposer for electrically connecting integrated circuits, the programmable interposer comprising:
   an interposer substrate;
   a programmable metallization cell (PMC) switch formed on the interposer substrate and coupled between a signal input and a signal output, wherein the PMC switch is electrically configurable between a high resistance state and a low resistance state; and
   a configuration controller coupled to the PMC switch and configured to set the PMC switch in the low resistance state or the high resistance state,
   wherein the PMC switch is a first PMC switch, wherein the programmable interposer further comprises a second PMC switch, wherein the configuration controller is further configured to set the second PMC switch in the low resistance state or the high resistance state,
   wherein the first PMC switch includes a PMC element having:
      an insulating material,
      an ion conductor formed at least partially within the insulating material,
      an oxidizable electrode positioned proximate to the ion conductor, and
      an indifferent electrode positioned proximate to the ion conductor, wherein the PMC element is a first PMC element, wherein the first PMC switch further includes a second PMC element sharing the indifferent electrode of the first PMC element.

2. The programmable interposer of claim 1, wherein the ion conductor comprises silicon oxide and copper.

3. The programmable interposer of claim 1, wherein the insulating material comprises the interposer substrate.

4. The programmable interposer of claim 1, further comprising a configuration controller coupled to the PMC switch and configured to set the PMC switch in the low resistance state by applying a switching threshold voltage to the indifferent electrode.

5. A programmable interposer for electrically connecting integrated circuits, the programmable interposer comprising:
   an interposer substrate;
   a programmable metallization cell (PMC) switch formed on the interposer substrate and coupled between a signal input and a signal output, wherein the PMC switch is electrically configurable between a high resistance state and a low resistance state; and
   a configuration controller coupled to the PMC switch and configured to set the PMC switch in the low resistance state or the high resistance state,
   wherein the PMC switch is a first PMC switch, wherein the programmable interposer further comprises a second PMC switch, wherein the configuration controller is further configured to set the second PMC switch in the low resistance state or the high resistance state, wherein the signal output is a first signal output, wherein the PMC switch is a four-terminal PMC switch coupled between the signal input, the first signal output, and a second signal output and electrically configurable to set one or both of the first signal output and the second signal output in the low resistance state.

6. A programmable interposer for electrically connecting integrated circuits, the programmable interposer comprising:
   an interposer substrate;
   a programmable metallization cell (PMC) switch formed on the interposer substrate and coupled between a signal input and a signal output, wherein the PMC switch is electrically configurable between a high resistance state and a low resistance state; and
   a configuration controller coupled to the PMC switch and configured to set the PMC switch in the low resistance state or the high resistance state,
   wherein the PMC switch is a first PMC switch, wherein the programmable interposer further comprises a second PMC switch, wherein the configuration controller is further configured to set the second PMC switch in the low resistance state or the high resistance state, wherein the PMC switch includes a plurality of PMC elements connected in a parallel configuration between the signal input and the signal output.

7. An integrated circuit packaging comprising:
   a programmable interposer including:
      an interposer substrate, and
      a programmable metallization cell (PMC) switch formed on the interposer substrate and coupled between a signal input and a signal output, wherein the PMC switch is electrically configurable between a high resistance state and a low resistance state,
      wherein the PMC switch includes a PMC element having:
         an insulating material,
         an ion conductor formed at least partially within the insulating material,
         an oxidizable electrode positioned proximate to the ion conductor, and
         an indifferent electrode positioned proximate to the ion conductor,
      wherein the PMC switch includes a plurality of PMC elements connected in a parallel configuration between the signal input and the signal output.

8. The integrated circuit packaging of claim 7, further comprising an integrated circuit component including the signal input and the signal output.

9. The integrated circuit packaging of claim 7, further comprising:
   a first integrated circuit component including the signal input; and
   a second integrated circuit component including the signal output.

10. The integrated circuit packaging of claim 7, wherein the programmable interposer further including a configuration controller coupled to the PMC switch and configured to set the PMC switch in the low resistance state or the high resistance state.

11. The integrated circuit packaging of claim 10, wherein the configuration controller is further configured to:
   set the PMC switch in the low resistance state by applying a switching threshold voltage to the PMC switch, and
   set the PMC switch in the high resistance state by applying a reverse bias voltage to the PMC switch.

12. A programmable interposer for electrically connecting integrated circuits, the programmable interposer comprising:
   an interposer substrate; and
   a programmable metallization cell (PMC) switch formed on the interposer substrate and coupled between a signal input and a signal output, wherein the PMC switch is electrically configurable between a high resistance state and a low resistance state,
   wherein the PMC switch includes a PMC element having:
      an insulating material,
      an ion conductor formed at least partially within the insulating material,
      an oxidizable electrode positioned proximate to the ion conductor, and
      an indifferent electrode positioned proximate to the ion conductor,
   wherein the PMC element is a first PMC element, wherein the PMC switch further includes a second PMC element sharing the indifferent electrode of the first PMC element.

13. The programmable interposer of claim 12, wherein the ion conductor comprises silicon oxide and copper.

14. The programmable interposer of claim 12, wherein the insulating material comprises the interposer substrate.

15. The programmable interposer of claim 12, further comprising a configuration controller coupled to the PMC switch and configured to set the PMC switch in the low resistance state by applying a switching threshold voltage to the indifferent electrode.

16. A programmable interposer for electrically connecting integrated circuits, the programmable interposer comprising:
   an interposer substrate; and
   a programmable metallization cell (PMC) switch formed on the interposer substrate and coupled between a signal input and a signal output, wherein the PMC switch is electrically configurable between a high resistance state and a low resistance state, wherein the signal output is a first signal output, wherein the PMC switch is a four-terminal PMC switch coupled between the signal input, the first signal output, and a second signal output and electrically configurable to set one or both of the first signal output and the second signal output in the low resistance state.

\* \* \* \* \*